United States Patent
Li et al.

(10) Patent No.: US 7,940,824 B2
(45) Date of Patent: May 10, 2011

(54) LASER DIODE DRIVER ARCHITECTURES

(75) Inventors: Shengyuan Li, Irving, TX (US);
Indumini Ranmuthu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 213 days.

(21) Appl. No.: 12/347,311

(22) Filed: Dec. 31, 2008

(65) Prior Publication Data
US 2010/0166031 A1 Jul. 1, 2010

(51) Int. Cl.
*H01S 5/06* (2006.01)
(52) U.S. Cl. .......... 372/38.07; 372/38.02; 372/38.08
(58) Field of Classification Search ............ 372/38.02, 372/38.07, 38.08
See application file for complete search history.

(56) References Cited

U.S. PATENT DOCUMENTS

| | | | |
|---|---|---|---|
| 6,717,463 B2* | 4/2004 | Aparin et al. | 330/149 |
| 6,972,624 B1* | 12/2005 | Stroet | 330/254 |
| 2009/0262769 A1* | 10/2009 | Bergmann et al. | 372/38.02 |

* cited by examiner

*Primary Examiner* — Minsun Harvey
*Assistant Examiner* — Michael Carter
(74) *Attorney, Agent, or Firm* — Dawn V. Stephens; Wade James Brady, III; Frederick J. Telecky, Jr.

(57) ABSTRACT

Laser diode driver architectures are disclosed. Some example current drivers are described, including a current channel to provide an output current. The current channel includes a current mirror with emitter degeneration, a startup transistor coupled to the current mirror to generate a DC bias on the current mirror, a beta helper circuit coupled to the current mirror and the startup transistor, to maintain the DC bias on the current mirror, and a cutoff transistor coupled to an emitter terminal of a current mirror transistor and to a reference voltage, to selectively couple the emitter terminal to the reference voltage to conduct the pre-determined output current. The example current drivers also include an output stage coupled to the output of the current mirror and to an output device, wherein the output stage provides a current gain in response to the cutoff transistor coupling the emitter terminal to the reference voltage.

19 Claims, 10 Drawing Sheets

LASER DIODE DRIVER ARCHITECTURES

FIELD OF THE DISCLOSURE

This disclosure relates generally to optical media and, more particularly, to laser diode driver architectures.

BACKGROUND

Laser diodes are often used in optical applications, such as fiber optics and optical media applications. Many optical applications require the laser diode to operate in multiple power states, and each power state requires a corresponding amount of current to be supplied to the laser diode. Therefore, devices and circuits that provide current to the laser diodes must be capable of providing varying levels of power. As data read and data write speeds increase in these applications, the driver circuits must also be capable of fast and accurate switching between the various levels. The driver circuits must also have minimal noise to reduce the occurrence of read errors.

SUMMARY

Laser diode driver architectures are disclosed. Some example current drivers are described, including a current channel to provide an output current. The current channel includes a current mirror with emitter degeneration, a startup transistor coupled to the current mirror to generate a DC bias on the current mirror, a beta helper circuit coupled to the current mirror and the startup transistor, to maintain the DC bias on the current mirror, and a cutoff transistor coupled to an emitter terminal of a current mirror transistor and to a reference voltage, to selectively couple the emitter terminal to the reference voltage to conduct the pre-determined output current. The example current drivers also include an output stage coupled to the output of the current mirror and to an output device, wherein the output stage provides a current gain in response to the cutoff transistor coupling the emitter terminal to the reference voltage.

DETAILED DESCRIPTION

Figure 1:
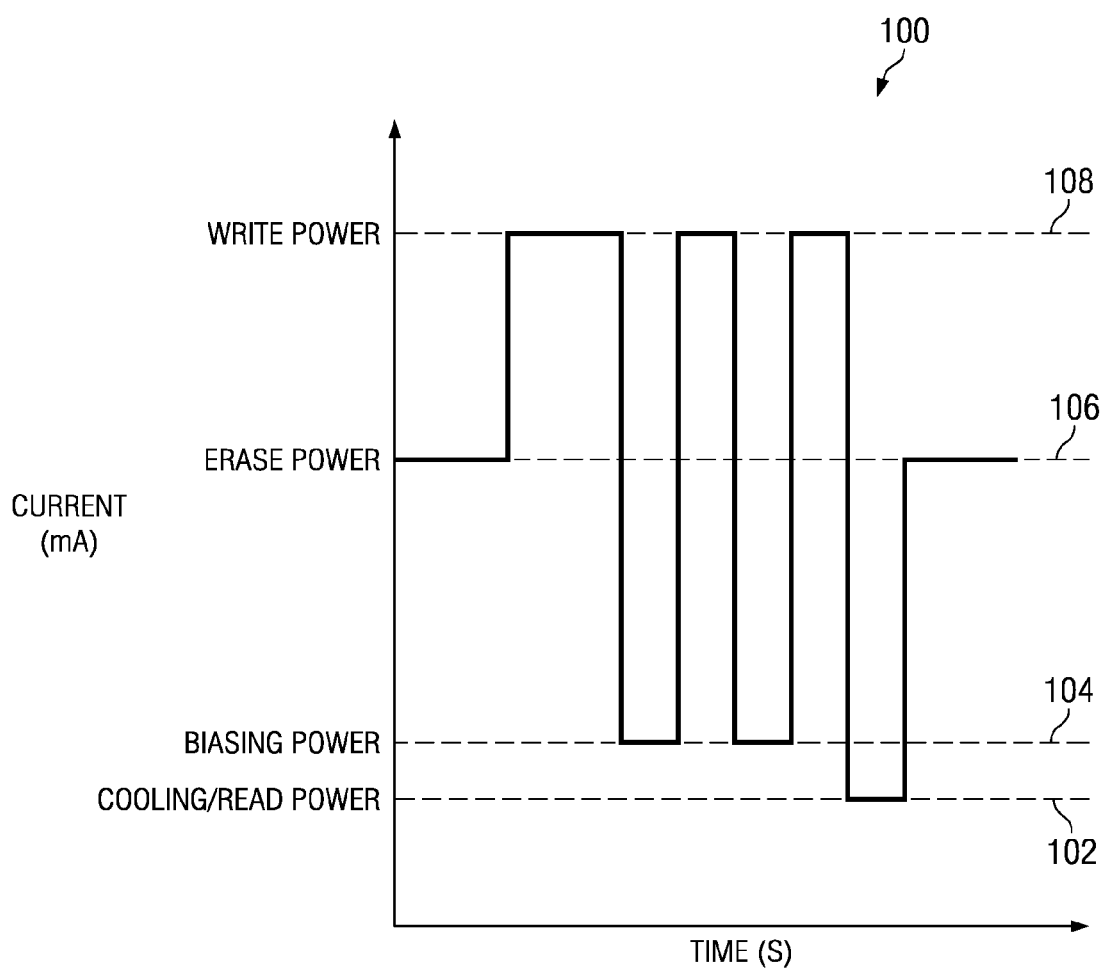
FIG. 1 is a diagram of example power levels for laser diode operations.

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example methods and apparatus, persons of ordinary skill in the art will readily appreciate that the examples are not the only way to implement such methods and apparatus.

The example methods and apparatus described herein may be used to drive a laser diode in, for example, an optical pickup unit. Some example circuits include several current channels, each of which provides a portion of current or power required for the laser diode to perform a given function. Each example channel includes a current mirror, a scaler switch to scale the current output from the channel, and a data switch to enable or disable each current channel to achieve a particular power level or operation mode. The scaler switch may be toggled by a current scaler device, which modifies the power output from the channels when necessary to provide appropriate power to the laser diode. The example methods and apparatus sum the currents from the channels to provide the correct current to the laser diode.

Some example current channels also include emitter degeneration resistors to achieve current matching and improved noise performance in the current mirror. Additionally, some example current channels may include a beta helper circuit to maintain the accuracy of the output current from the current mirror. Some example beta helper circuits may include a stabilizer branch to stabilize the current in the beta helper circuit. Further, some example beta helper circuits may include a biasing circuit to individually control the current biasing of the current mirror via the beta helper circuit.

The example apparatus described herein provide a laser diode driver with low voltage operation, high current switching speed, high current accuracy, and reduced noise relative to previous solutions. Additionally, dividing the current switching into multiple channels reduces current overshoot and current undershoot when switching current levels and provides higher laser diode driver circuit reliability. Further, the example apparatus reduce the effects of the gain-bandwidth limitation on switching speed, because each current channel has primarily direct current (DC) gain, which allows for greater operational bandwidth and switching speed.

Although the example methods and apparatus described herein implement bipolar technology with emitter degeneration, the examples may be modified to implement metal-oxide-semiconductor (MOS) technology with similar methods of degeneration.

FIG. 1 is a diagram 100 of example power levels for laser diode operations. In applications such as, for example, an optical disc drive having disc reading and disc burning capabilities, a laser diode is capable of various modes or states of operation. Each state has different power requirements, and applications requiring high read/write speeds require high switching speeds between states. In the example of FIG. 1, a laser diode can exist in a read/cooling state, a biased state, an erasing state, and a writing state. The example read/cooling state requires the lowest power level 102. The biased state requires a power level 104 higher than the read/cooling power level 102. The erasing state requires the next higher power level 106, and the writing state requires the highest power level 108.

Figure 2:
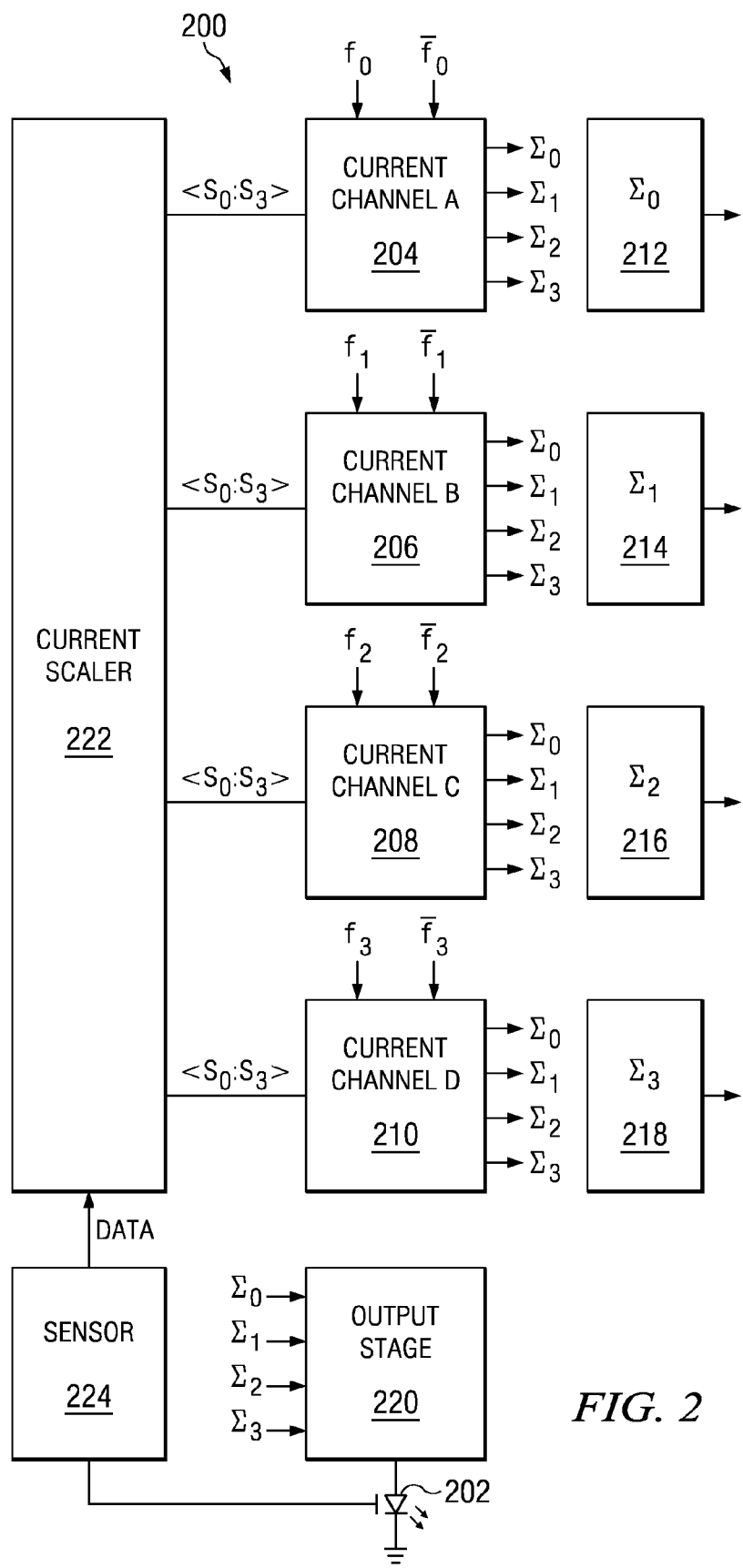
FIG. 2 is a block diagram of an example laser diode driver.

FIG. 2 is a block diagram of an example laser diode driver 200. The example laser diode driver 200 may be used to drive a laser diode 202 at various power levels (e.g., the example power levels illustrated in FIG. 1). The various power levels are generated via several current channels A 204, B 206, C 208, and D 210. The current channels 204-210 maintain a DC bias and may be enabled or disabled via data signals $\Phi_{0-3}$ and $\Phi_{0-3}$.bar, respectively, to adjust the laser diode 202 power level. The laser diode driver 200 further includes summers 212, 214, 216, and 218, which sum the drive currents from the current channels 204-210 and output the summed currents to an output stage 220. The output stage 220 then sums the currents from the summers 212-218 and outputs a proportional current to the laser diode 202.

The laser diode driver 200 further includes a current scaler 222. The current scaler 222 may adjust the current outputs from the current channels 204-210 based on received laser diode functionality data. The functionality data may be provided by, for example, a sensor 224. The sensor 224 may detect operational characteristics of the laser diode 202 to determine when the current to the laser diode 202 should be increased or decreased. For example, a new laser diode and/or new media require less power to perform a given function (e.g., the functions described in FIG. 1) than a fatigued laser diode or dirty media. The sensor 224 may detect characteristics such as, for example, total operational time, number of write errors, number of write cycles, or other characteristic data. The sensor 224 may also be modified to sense characteristic data for other types of output devices.

To adjust the overall current scale, the current scaler 222 controls each current channel 204-210 via example signals $S_0$, $S_1$, $S_2$, and $S_3$, corresponding to four example power scales. By adjusting the signals $S_0$-$S_3$, the current scaler 222 causes corresponding outputs $\Sigma_0$-$\Sigma_3$ of the current channels 204-210 and corresponding summers 212-218 to disable the respective current to the output stage. For example, if the signals S0 and S1 are enabled and S2 and S3 are disabled, the outputs from the current channels 204-210 are limited to $\Sigma_0$ and $\Sigma_1$. The $\Sigma_0$ and $\Sigma_1$ summers 212 and 214 sum the respective currents and output the summed currents to the output stage 220. The example signals $S_0$-$S_3$ may also be represented via a two-bit digital signal provided to each current channel 204-210 in a known manner.

In the illustrated example of FIG. 2, the current scaler 222 controls the current channels 204-210 uniformly via the signals $S_0$-$S_3$. That is, the output currents from the current channels 204-210 are increased or decreased proportionally based on how many of the scaling signals $S_0$-$S_3$ are on. However, in some example implementations, the current scaler 222 may scale one or more current channels 204-210 individually. To use the laser diode device 202 as an example, after using the device 202 for some time, the read/cooling state requires additional power to read properly. As a result, the current scaler 222 may turn on the scaling signal S1 for the current channel A 204 while leaving the scaling signals S1 off for the remaining current channels 206-210. If the current from current channel A 204 is not large relative to the other current channels 206-210, S1 may remain on for other power states without substantially affecting the other power states. However, if the additional power provided from current channel A 204 substantially affects other power states, the current scaler 222 may be required to turn off S1 to the current channel 204 while the laser diode 302 is not in the read/cooling state.

The current channels 204-210 are individually enabled or disabled via respective complementary data signals $\Phi_{0-3}$ and $\Phi_{0-3}$.bar. The data signals $\Phi_{0-3}$ and $\Phi_{0-3}$.bar enable or disable each current channel based on the power requirements for a desired operation. In some examples, the output stage 220 may implement the current summing performed by one or more of the summers 212-218, and may therefore interact directly with one or more of the current channels 204-210. Generally, the scaling signals $S_0$-$S_3$ provide a global adjustment in current levels for the current channels 204-210. In contrast, the data signals $\Phi_{0-3}$ and $\Phi_{0-3}$.bar control the individual current channels 204-210, respectively, to adjust the power state of the laser diode 202.

Figure 11:
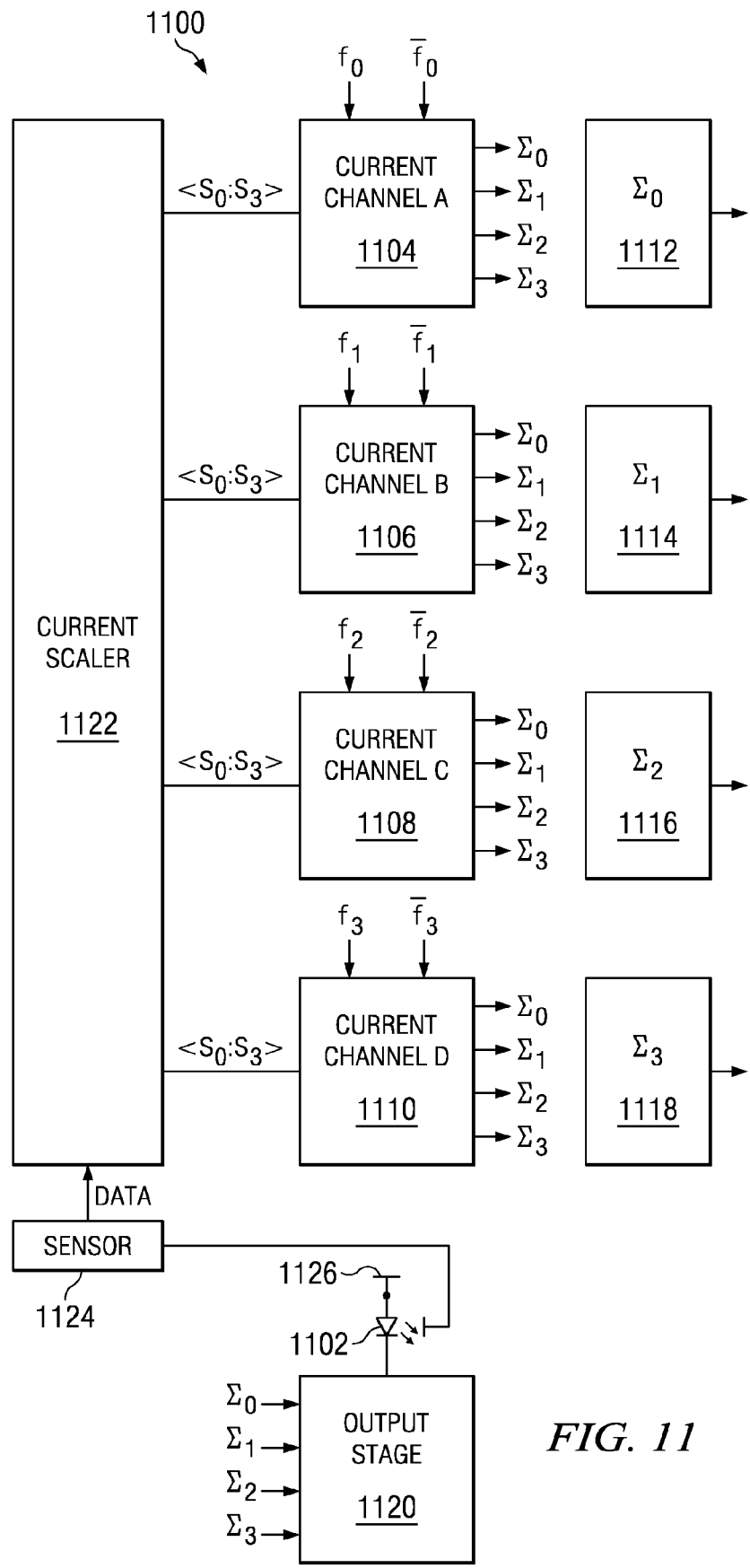
FIG. 11 is a block diagram of another example laser diode driver.

The example laser diode driver 200 of FIG. 2 illustrates a high side laser diode driver. In contrast, FIG. 11 illustrates an example low side laser diode driver as described below.

Figure 3:
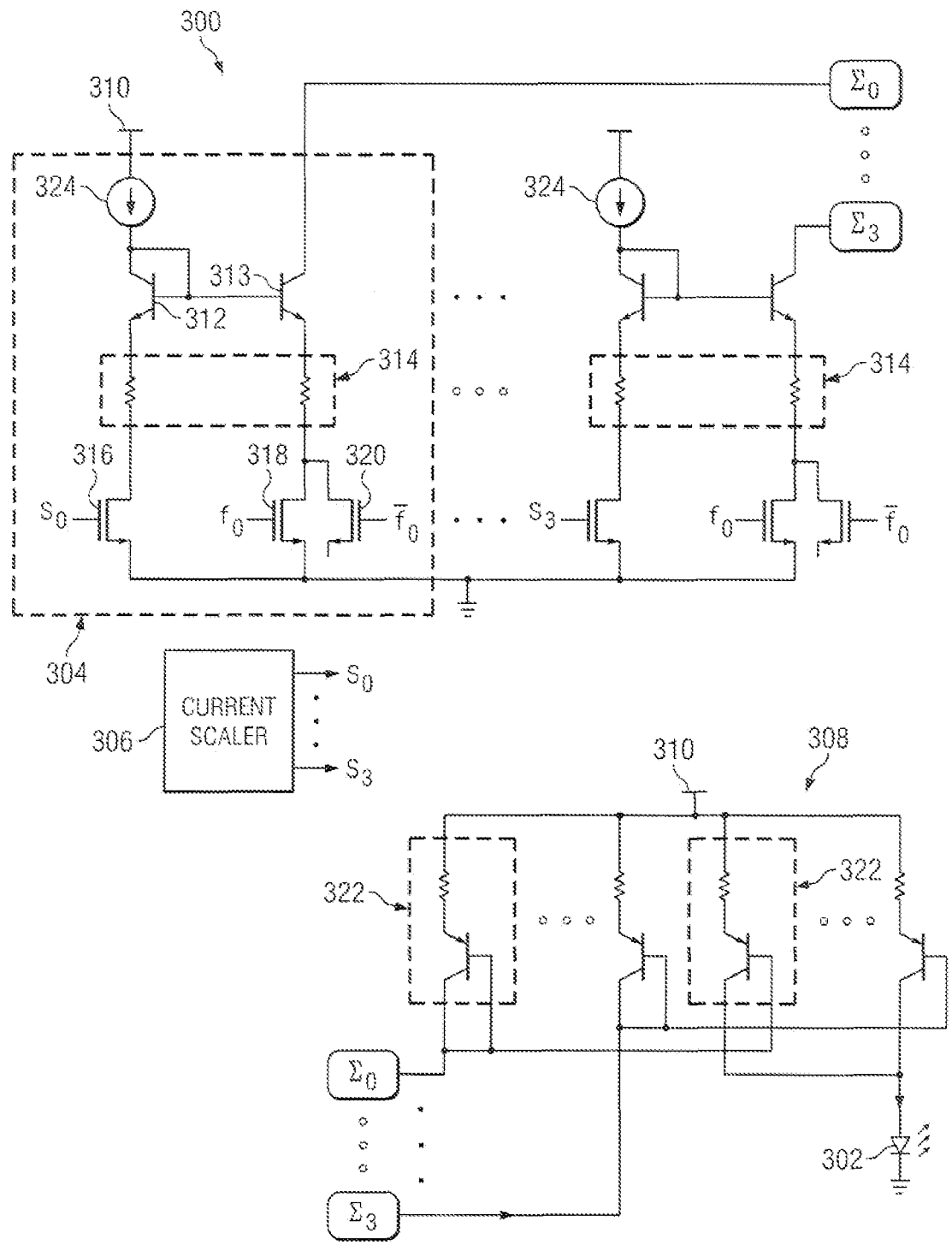
FIG. 3 is a schematic diagram of an example high side current channel.

FIG. 3 is a schematic diagram of an example high side current channel 300. The example high side current channel 300 may be used to implement any of the current channels 204-210 of FIG. 2 to drive a laser diode 302 at various power levels. To drive the laser diode 302, the example current channel 300 includes several current mirror amplifiers 304. A first current channel 300, which may be used to implement the current channel A 204 of FIG. 2, is illustrated in FIG. 3. Additional current channels 300 may be used to implement the current channels 206-210 of FIG. 2 in a similar way. The current channel 300 may be partially enabled or disabled based on a current scaler 306 (e.g., the current scaler 222 of FIG. 2) via signals $S_0$-$S_3$ and thereby control a portion of an output stage 308. The output stage 308 includes several output current mirror amplifiers 322 to conduct the appropriate current from a power supply 310 to the laser diode 302. The high side current channel 300 is configured to conduct current from the power supply 310 to the anode of the laser diode 302. The example current mirror 304 includes an input transistor 312 and an output transistor 313.

The example current channel 300 includes four bipolar transistor current mirrors (e.g., the current mirror amplifier 304). The current mirror 304 further implements emitter degeneration 314 to reduce noise, improve transistor matching, and increase stability of the current mirror amplifier 304 gain in the current mirror 304 using, for example, emitter degeneration resistors.

The current channel 300 further includes MOS transistors 316 to scale the drive current from the current channel 300 based on signals $S_0$-$S_3$ received from the current scaler 306. The scaling signals $S_0$-$S_3$ control the MOS transistor 316. While the example laser diode 302 does not require the current from the current channel 300, the signal $S_0$ is logical zero, which cuts off the MOS transistor 316 and prevents the current mirror amplifier 304 from generating an output current. Even when the current channel 304 is disabled (i.e., not outputting current), the current mirror amplifier 304 remains DC biased to enable rapid switching.

The current scaler 306 (e.g., via the MOS transistors 316) scale the current output of the current channel 300 by enabling one or more current mirror amplifiers (e.g., the current mirror amplifier 304). By enabling more current mirror amplifiers 304, the current scaler 306 modifies the output current to control the output stage 308, increasing the current through the laser diode 302 at every operating mode (e.g., erasing, writing). In contrast, by disabling more current mirrors 304 via the MOS transistors 316, the current through the laser diode 302 at each operating mode is decreased.

The current channel 300 further includes MOS transistors 318 and 320 to control the output of the current channel 300. The MOS transistors 318 and 320 are driven by data signals $\Phi_0$ and $\Phi_0$.bar, which are complementary signals (i.e., have a 180° phase shift). By switching the states of $\Phi_0$ and $\Phi_0$.bar, the current mirror amplifier 304 may be enabled or disabled to change the power state of the laser diode 302.

The MOS transistors 316 and 318 may be considered cutoff transistors, which selectively couple the emitter terminals of respective transistors 312 to a reference voltage (e.g., the ground terminal). By selectively coupling the emitter terminals to the reference voltage, the output current is enabled more quickly when $S_0$ or $\Phi_0$ enables the MOS transistor 316 or 318, respectively. As a result, the connection increases the speed and decreases overshoot and undershoot when switching operating modes.

Additional current channels include similar elements as the current channel 304. However, the additional current channels may be configured to output a different current than the current channel 300. For example, the current channel 300 (e.g., the current channel 204 of FIG. 2) may be configured to output sufficient current to enable the laser diode 302 to exist in a first operating state or mode A (e.g., the read/cooling state of FIG. 1). Another current channel (e.g., the current channel 206 of FIG. 2) may then be configured to output only as much additional current as necessary to change the laser diode 302 to the next state B (e.g., the biasing state of FIG. 1) above the state A. In other words, two current channels, including the current channel 300, are used for the laser diode 302 to exist in state B instead of disabling the current channel 300 and using one current channel to generate state B. Such a configuration allows for rapid switching between laser diode states. In a similar manner, third and fourth current channels may be included to further increase the laser diode 302 power to a next higher states C (e.g., the erase state of FIG. 1) and D (e.g., the write state of FIG. 1).

Each example current mirror amplifier 304 has a current source 324. Each current source 324 is set independently, based on the desired incremental current provided by the current channel 300.

In the example of FIG. 3, the current mirror amplifier 304 sinks current and causes current to flow from the power supply 310 through an output current mirror amplifier 322. The output current mirror amplifier 308 generally has a larger output channel than the current mirror amplifier 304 to allow for fast switching response. Additionally, the output current mirror amplifier 322 is configured to include emitter degeneration to improve current accuracy and noise performance. While the scaler 306 enables $S_0$, the current channels (e.g., the current channels 204-210 of FIG. 2) that are enabled via data signals $\Phi_0$ and $\Phi_0$.bar output currents that are summed at a summer $\Sigma_0$ (e.g., the summer 212). The summed current from the summer $\Sigma_0$ drives the output current mirror amplifier 322 to output a current to the laser diode 302. The output current from the output current mirror amplifier 322 is then summed with currents output from additional output current mirror amplifiers based on the additional scaling signals $S_1$-$S_3$ scaling the current channels (e.g., 204-210). The output currents then drive the laser diode 302 at the desired scaled power level.

Figure 4:
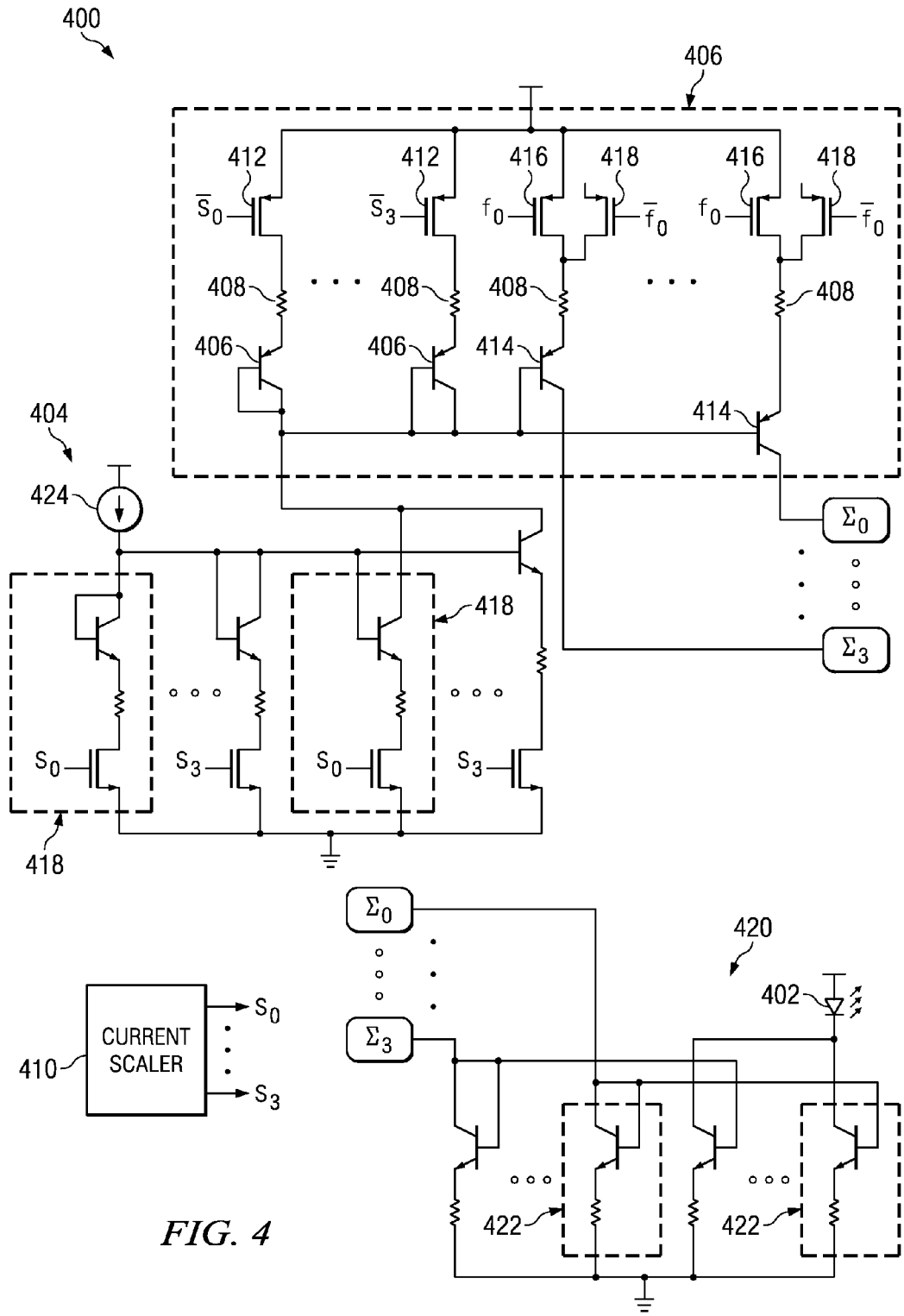
FIG. 4 is a schematic diagram of an example low side current channel.

FIG. 4 is a block diagram of an example low side current channel 400. The example low side current channel 400 may be used to drive a laser diode 402 at various power levels by changing the current pulled from the cathode of the laser diode 402. The low side current channel 400 includes similar components to the example high side current channel 300 of FIG. 3. However, as noted above, the components of the low side current channel 400 are configured to conduct current from the cathode of the laser diode 402 to ground. Additionally, the low side current channel 400 includes an additional stage 404 to enable sufficiently rapid switching between current levels.

The example low side current channel 400 includes several input current transistors 406 and corresponding emitter degeneration resistors 408. The input current transistors are individually selectable via the scaling signals $S_0$-$S_3$ from a current scaler 410 (e.g., the current scaler 222 of FIG. 2). The scaling signals $S_0$-$S_3$ control respective MOS transistors 412.

The low side current channel 400 also includes several output transistors 414. The example output transistors 414 also include emitter degeneration resistors 408. Data signals $\Phi_0$ and $\Phi_0$.bar control respective complementary MOS transistors 416 and 418 to enable or disable the current channel 400.

The example current channel 400 outputs respective currents to the output stage 420 (e.g., the example output stage 220 of FIG. 2), which includes output current mirrors 422. The output mirrors provide a current gain to the output laser diode 202 based on the scaling signals $S_0$-$S_3$ and the data signals $\Phi_{0-3}$ and $\Phi_{0-3}$.bar. The example current channel 400 is controlled via the data signals $\Phi_0$ and $\Phi_0$.bar.

While $\Phi_0$ enables the MOS transistors 416, one or more of the MOS transistors 412 are also enabled. Depending on the ratio of enabled MOS transistors 412 to MOS transistors 416, the output transistors 414 conduct a proportional current, and cause a proportional current in the output current mirrors 422. For example, if $S_0$ enables the corresponding MOS transistor 412, and the remaining MOS transistors 412 are disabled, the ratio of enabled MOS transistors 412 to MOS transistors 416 causes the output transistors 414 to provide the maximum current to the output stage 420 and to the laser diode 402. In contrast, if $S_0$-$S_3$ enabled all the MOS transistors 412, the ratio causes less current through the output transistors 414, and thereby causes less current through the output stage 420 and to the laser diode 402.

Unlike the example current channel 300 of FIG. 3, the example current channel 400 only requires one input current source 424.

In contrast to the current channel 300 of FIG. 3, the current channel 400 utilizes p-channel transistors, which generally have slower switching rates than n-channel transistors. Therefore, an additional current gain stage 404 is provided to increase the switching speed of the current channel 400. The current gain stage 404 includes gain channels 418 to increase the switching speed of the current channel 400. Each gain channel 418 is controlled via the same current scaler 410 signals $S_0$-$S_3$ as the corresponding input transistor 406. Thus, when additional current is required by the laser diode 402, a scaling signal (e.g., $S_1$) is switched to logical one, changing the amplifier ratio and causing additional current to flow through the gain channel 418 and through the current channel 400 to the output stage 420.

Figure 5:
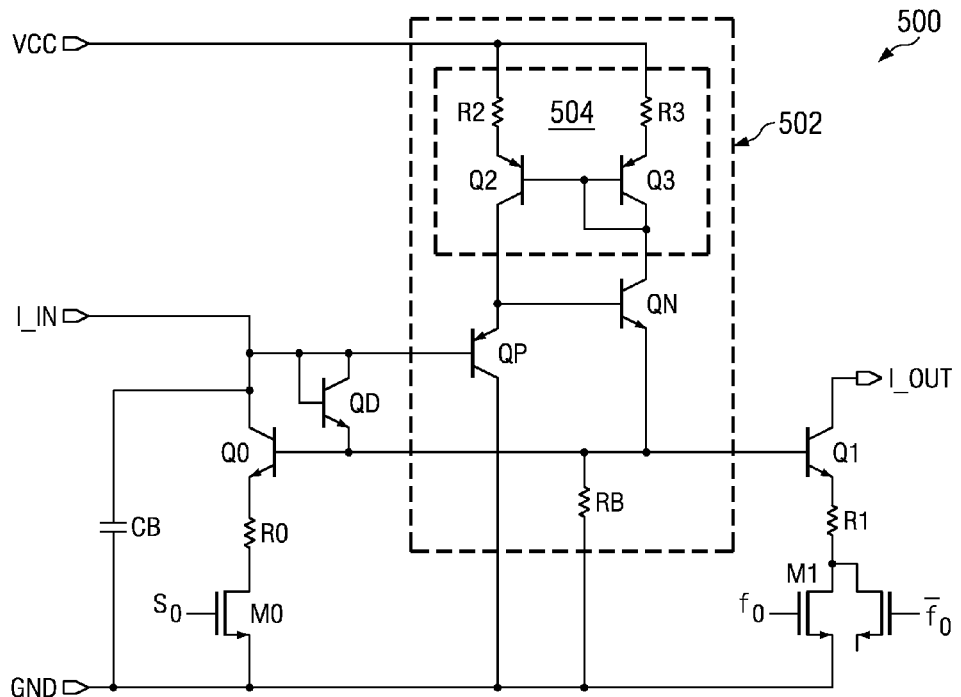
FIG. 5 is a schematic diagram of an example low voltage current mirror to implement the example high side laser diode driver of FIG. 3.

FIG. 5 is a schematic diagram of an example low voltage current mirror 500 to implement the example high side current channel 300 of FIG. 3. In particular, the example low voltage current mirror 500 may be used to implement the example current mirror amplifier 304 of FIG. 3.

The example low voltage current mirror 500 includes two bipolar transistors Q0 and Q1, which make up a basic current mirror amplifier. In general, the input transistor Q0 receives a current signal I_IN and the output transistor Q1 outputs a drive current I_OUT proportional to I_IN. Q0 and Q1 are coupled to emitter degeneration resistors R0 and R1. Q0, Q1, R0, and R1 may be configured to have a constant or substantially constant current gain. The example current gain may be unity or greater.

In general, current mirrors do not meet the accuracy or noise requirements for some applications. To increase the accuracy and noise performance, the example low voltage current mirror 500 further includes a beta helper circuit 502. The beta helper circuit 502 includes bipolar transistors QN, QP, Q2, and Q3, and resistors RB, R2, and R3. The base-emitter junction of the transistor QN provides a substantially constant step up in voltage from the emitter terminal of QN (i.e., the base terminal of Q0) to the base terminal of QN. The base-emitter junction of the transistor QP then provides a substantially constant step down from the emitter terminal of QP (i.e., the base terminal of QN) to the base terminal of QP (i.e., the collector terminal of Q0). The voltage step down of QP is a substantially equal and opposite voltage step as the voltage step up of QN. As a result of the voltage steps, the collector terminal of Q0 is substantially the same voltage as the base terminal of Q0, thereby implementing a current mirror circuit.

A beta helper current mirror 504, including transistors Q2 and Q3, ensures the currents flowing through QP and QN are equal or substantially equal. As a result, Q2 and Q3 ensure the step up voltage of QN and the step down voltage of QP remain equal or substantially equal for a full complementary process where the NPN and PNP types of transistors have the same strength. The base terminal of Q0, the transistors QN and QP, and the collector terminal of Q0 form a negative feedback loop that resists biasing changes in the current mirror 500. Thus, the example current mirror 500 remains substantially at the desired biasing point.

Additionally, the example current mirror 500 is provided with a transistor QD to achieve the desired bias point at startup of the circuit as described below.

The example beta helper circuit 502 further includes a resistor RB to control the current flowing through the beta helper circuit 502. The resistor RB reduces power consumption of the beta helper circuit 502 based on selection of RB.

The example transistors Q0 and Q1 of the current mirror 500, and the example transistors Q2 and Q3 of the beta helper current mirror 504 include emitter degeneration resistors R0, R1, R2, and R3, respectively. The emitter degeneration resistors R0-R3 are included to reduce the dependence of current mirror gain on temperature and material fluctuations, which improves transistor matching and improves noise performance in the low voltage current mirror 500. In the example of FIG. 5, the resistances of R0-R3 are selected to be as large as possible without adversely impacting the bias points of the respective transistors. For example, resistors that are too large may reduce the "head room" of the transistor. That is, the amplified current or voltage levels may reach the maximum voltage as defined by VCC, or the minimum voltage as defined by ground, thus causing distortion. Additionally, R2 and R3 are selected to be equal or substantially equal. R0 and R1 may be selected to be equal or may be selected to have different resistances based on the desired current gain of the current mirror 500.

To enable or disable the output current in the example low voltage current mirror 500, the current mirror 500 includes MOS transistors M0 and M1. The MOS transistor M0 is controlled by one of the scaling signals S0, and M1 is controlled by data signals $\Phi_0$ and $\Phi_0$.bar. The signal $S_0$ may be provided by a current scaler as described above. If the example scaling signal $S_0$ is at logical zero (i.e., 0, low), M0 cuts off current flowing through the current mirror 500. If the example data signal $\Phi_0$ is at logical zero and $\Phi_0$ is at logical one, the M1 cuts off current flowing through the current mirror 500.

The example low voltage current mirror 500 further includes a bypass capacitor CB to reduce noise. The bypass capacitor CB may attenuate high frequency noise from the current mirror input signal in a known manner to improve noise performance and stability.

In operation, the example low voltage current mirror establishes a DC bias point at the start up of the example high side current channel 300 of FIG. 3. To this end, the power supply voltage VCC ramps up to the desired voltage. Additionally, the input current I_IN increases to the DC bias point. While the negative feedback loop of the beta helper circuit 502 attempts to maintain the collector and base voltages of Q0 equal, QD provides a voltage drop between the collector and base terminals of Q0. Therefore, while the collector voltage of Q0 increases due to I_IN, QP and QN cause the base voltage of Q0 to follow the collector voltage of Q0. When I_IN has reached a stable DC voltage, QP and QN stabilizes the base voltage Q0 at the collector voltage of Q0.

While the MOS transistors M0 and/or M1 remain off, Q0 and Q1 do not conduct current, but remain at the desired bias level. When the output device (e.g., the laser diode 202 of FIG. 2) requires additional power to change power states, $\Phi_0$ is set to logical one (i.e., 1, high) and $\Phi_0$.bar is set to logical zero, which turns enables M1 to conduct current. If the current scaler (e.g., the current scaler 222 of FIG. 2) changes the global current scaling signals $S_0$-$S_3$, the signal $S_0$ may be turned on to conduct current while the data signals $\Phi_0$ and $\Phi_0$.bar enable the MOS transistors M1. As a result, Q0 conducts the desired current, causing Q1 to conduct a current proportional to the current gain of the current mirror 500. When the output device no longer requires the power supplied by the current mirror 500, $S_0$ and/or $\Phi_0$ is set to logical zero, which cuts off the flow of current through Q0, thereby cutting off the drive current I_OUT through Q1.

Figure 6:
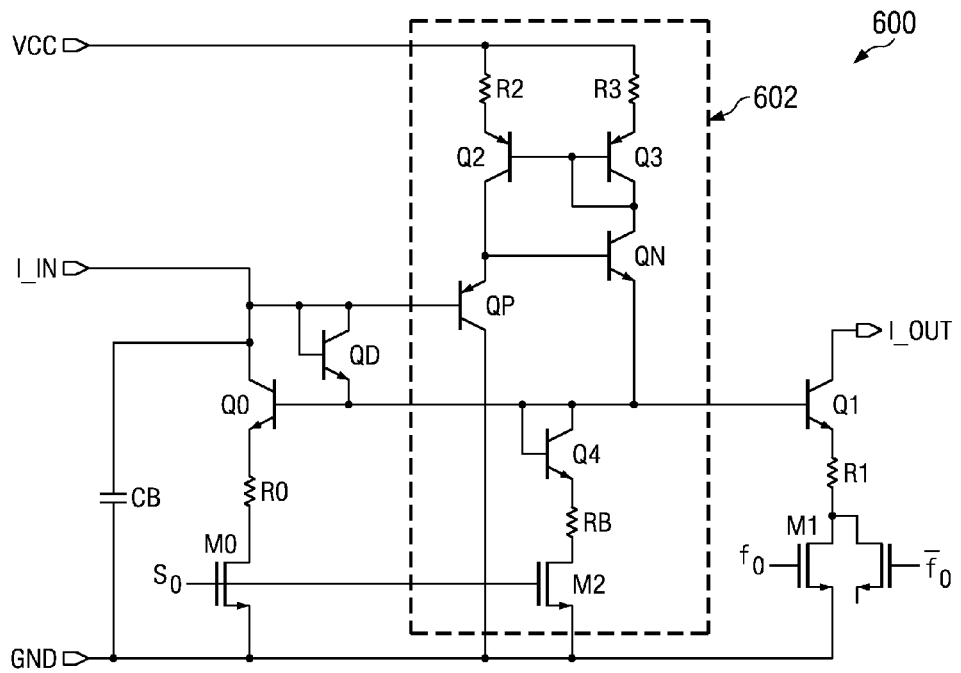
FIGS. 6-9 are schematic diagrams of alternate example low voltage current mirrors to implement the example high side laser diode driver of FIG. 3.

FIG. 6 is a schematic diagram of another example low voltage current mirror 600 to implement the example high side current channel 300 of FIG. 3. The current mirror 600 is similar to the example low voltage current mirror 500 of FIG. 5. However, the beta helper circuit 602 of the current mirror 600 further includes an additional bipolar transistor Q4 and an additional MOS transistor M2. Relative to the beta helper circuit 502 of FIG. 5, the example beta helper circuit 602 has more predictable currents through the transistors Q2 and Q3, and has reduced leakage current when the drive current I_OUT of the current mirror 600 is disabled.

In particular, the additional MOS transistor M2 cuts off the current flowing through the resistor RB when the scaling signal $S_0$ disables the current mirror 600. When the output device requires additional power, the transistor M2 is turned on, permitting proper operation of the beta helper circuit while the output of the current mirror 600 is enabled.

During operation, the transistor Q4 conducts a current proportional to the current through Q0. The current conducted by the transistor Q4 may be configured to conduct a desired proportion of the current flowing through Q0. As a result, the currents through QN and QP are proportional to the current through Q0, reducing fluctuation in the bias point of the current mirror 600. While the output of the current mirror 600 is disabled, Q4 remains biased to allow for rapid switching.

Figure 7:
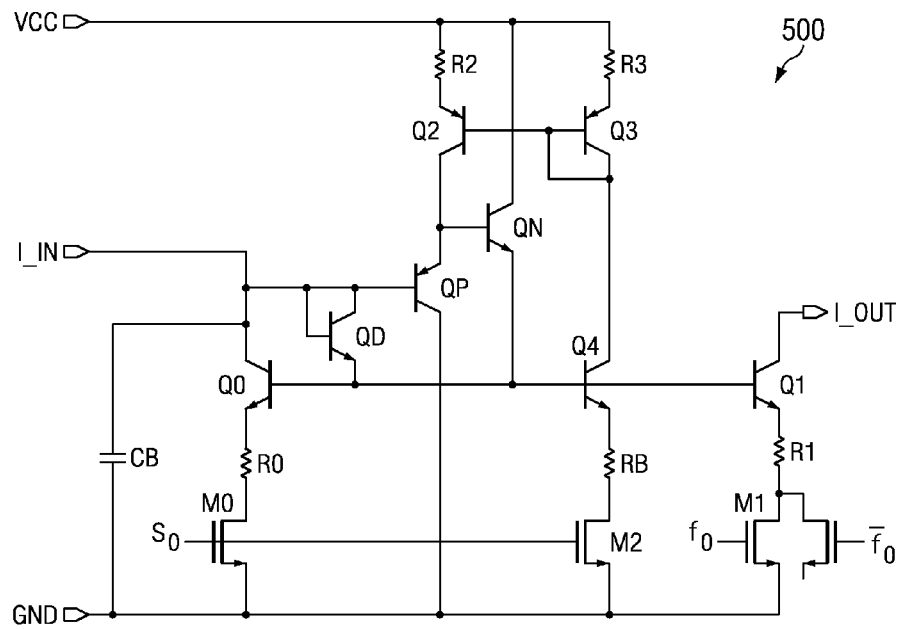

FIG. 7 is a schematic diagram of yet another example low voltage current mirror 700 to implement the example high side current channel 300 of FIG. 3. The current mirror 700 is similar to the example low voltage current mirror 600 of FIG. 6. However, the example current mirror 700 of FIG. 7 adjusts the terminal connections of the transistor QN to increase the collector-emitter junction voltage ($V_{CE}$) of QN relative to the current mirror 600 of FIG. 6. To this end, the collector terminal of QN is coupled directly to the power supply voltage VCC. Additionally, the collector of Q4 is coupled directly to Q3. As a result, the base-emitter junction voltage of QN is more stable, which reduces noise in the current mirror 700.

Figure 8:
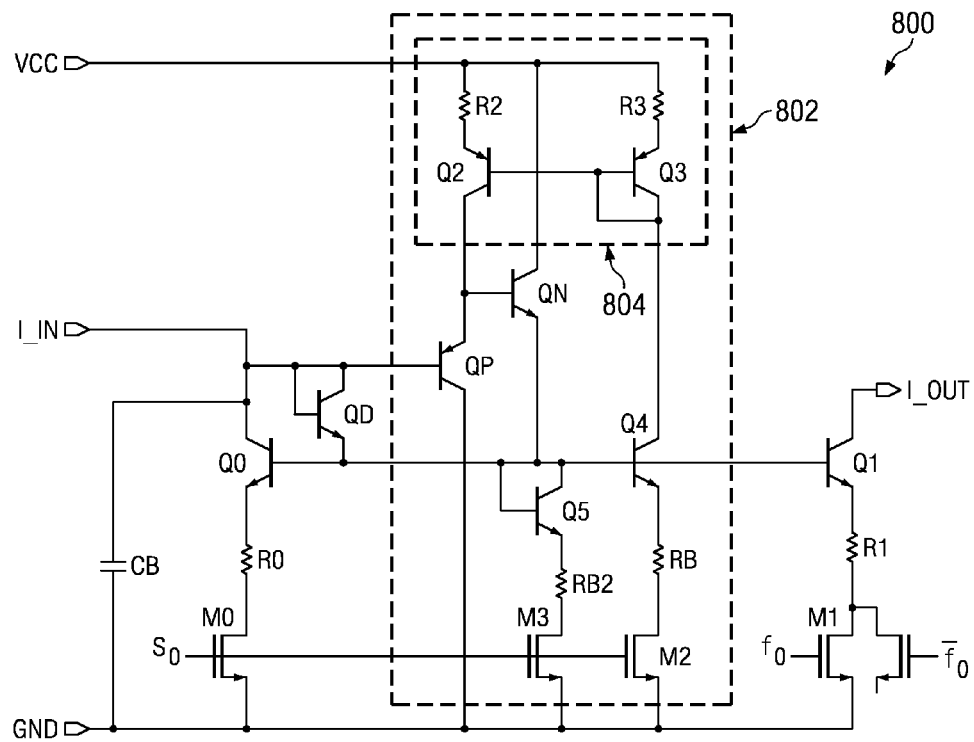

FIG. 8 is a schematic diagram of still another example low voltage current mirror 800 to implement the example high side current channel 300 of FIG. 3. The current mirror 800 is similar to the example low voltage current mirror 700 of FIG. 7. The beta helper 802 includes an additional bipolar transistor Q5, an additional resistor RB2, and an additional MOS transistor M3 to provide a bias current for QN. The base terminal of Q5 is coupled to the base terminal of Q0 and Q4. Thus, Q5 conducts a proportional current to Q0. In the example of FIG. 8, Q4, Q5, RB, and RB2 are configured to conduct equal or substantially equal currents. As a result, the beta helper current mirror 804 conducts the same current through QP as the current conducting through QN via Q5. The equal currents result in more equal and more stable step up voltage in QN and step down voltage in QP, and cause the collector-base voltage of Q0 to be as small and stable as possible.

The addition of Q5, RB2, and M3 further removes the effect of a potential positive feedback loop, which includes Q4, Q3, Q2, and QN. In case of positive feedback through the loop, Q5 may adjust accordingly to prevent undesirable effects. The MOS transistor M3 prevents large leakage current from flowing while the current mirror 800 is not active. When the output device requires additional current, $S_0$ is changed to logical one, and M3 permits Q5 to conduct current. When the output device no longer requires the additional current from the current mirror 800, $S_0$ is changed to logical zero and M3 turns off to prevent leakage current.

Figure 9:
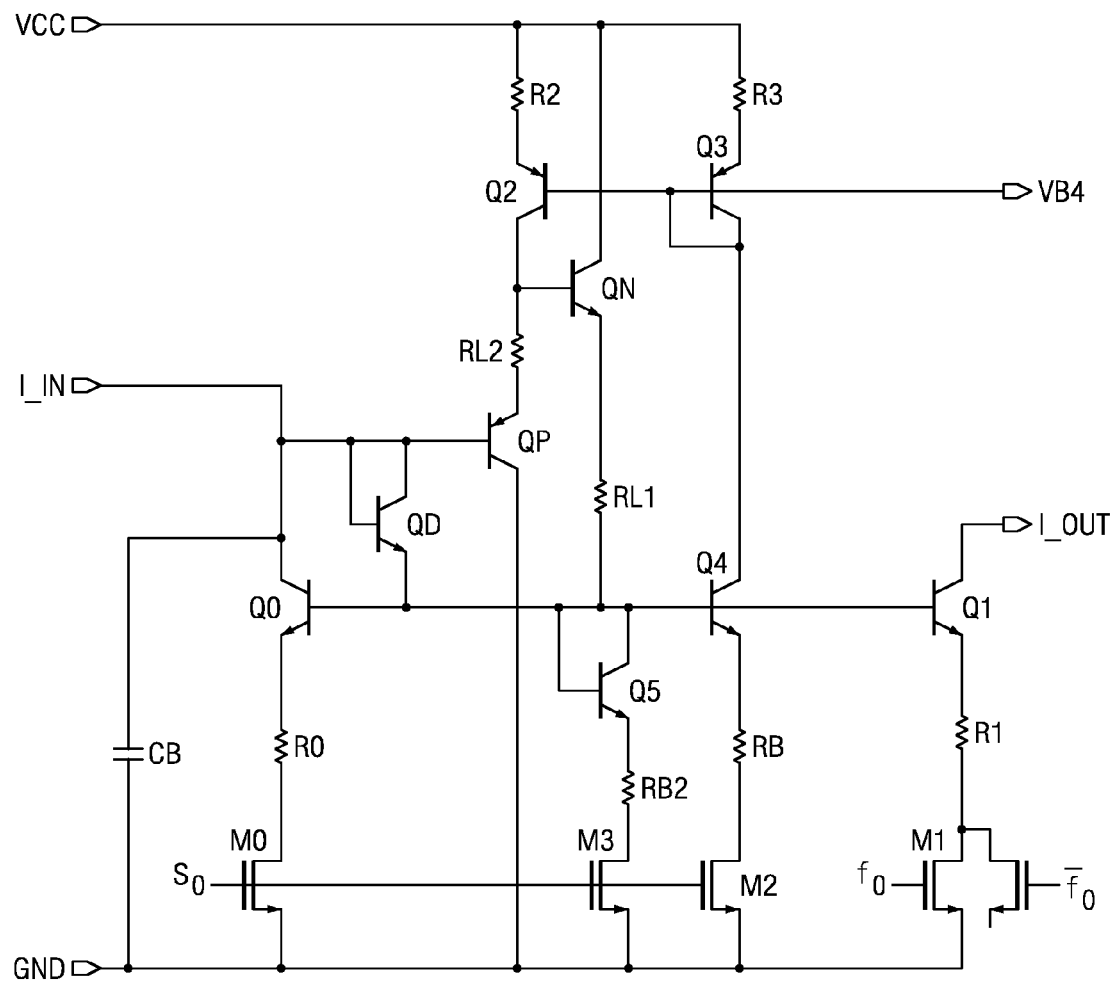

FIG. 9 is a schematic diagram of another example low voltage current mirror 900 to implement the example high side current channel 300 of FIG. 3. The current mirror 900 is similar to the example low voltage current mirror 800 of FIG. 8, and includes one or more level shifting resistors RL1 and/or RL2. Either of the level shifting resistors RL1 and RL2 may be included to level shift the bias point at the base terminal of Q0. The drive current I_OUT response may thus be modified to be more or less responsive to the input current I_IN.

Figure 10:
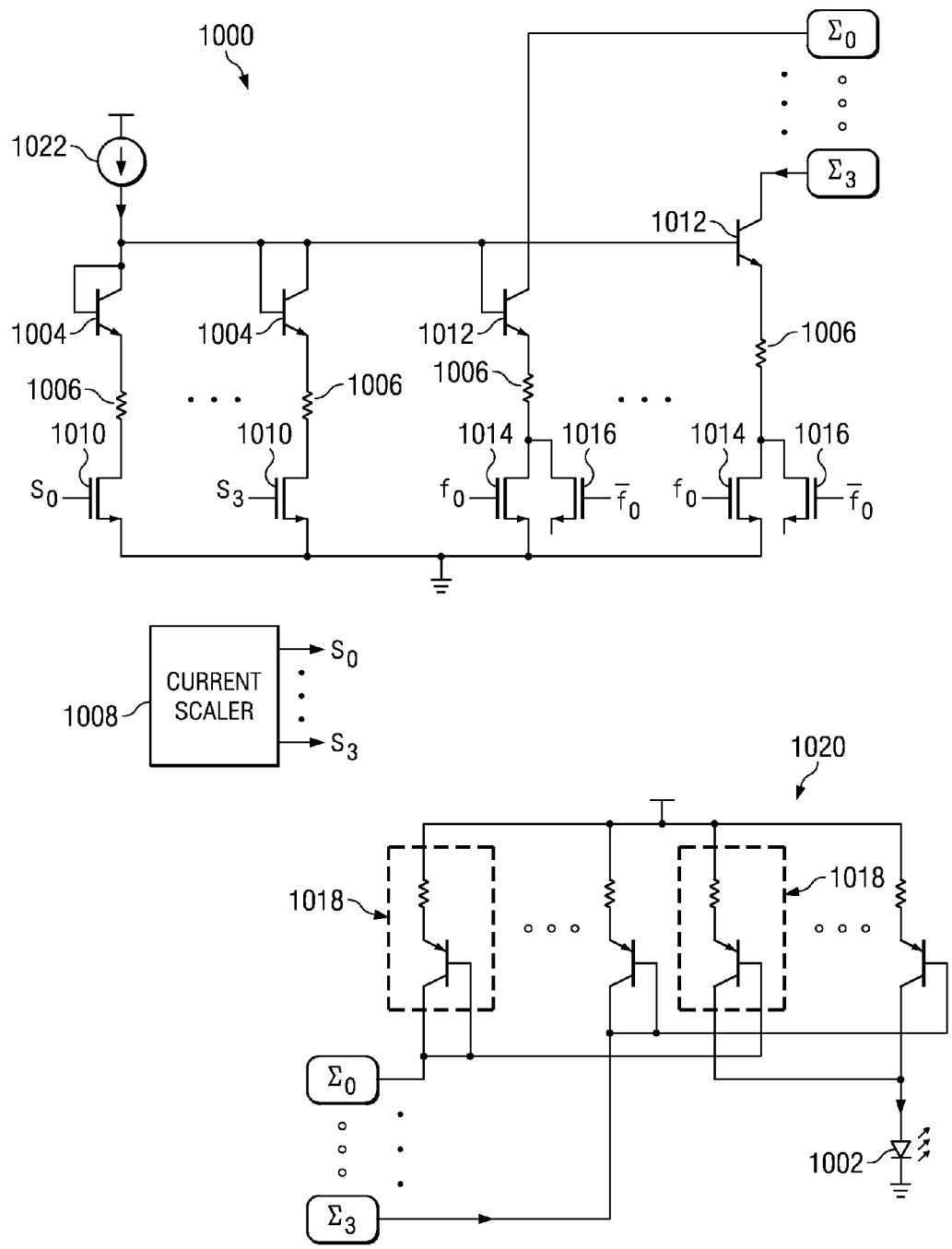
FIG. 10 is a schematic diagram of another example high side current channel.

FIG. 10 is a schematic diagram of another example high side current channel 1000. The high side current channel 1000 may be use to implement one or more of the current channels 204-210 of FIG. 2 to drive a laser diode 1002 at multiple current levels.

The example high side current channel 1000, like the low side driver 400, includes several input transistors 1004 and output transistors 1012 to implement the example current channels 204-210 of FIG. 2. Each example input transistor 1004 and output transistor 1012 implements emitter degeneration using resistors 1006. A current scaler 1008 provides scaling signals $S_0$-$S_3$, which control corresponding MOS transistors 1010 to scale the output current from the current channel 1000. The current channel 1000 further includes MOS transistors 1014 and 1016 to control the output of the current channel 1000 via data signals $\Phi_0$ and $\Phi_0$.bar, respectively. When the MOS transistors 1014 enable the current mirror amplifier 1000 output, the output transistors 1012 provide an output current to an output current mirror amplifier 1018 in an output stage 1020. The output current mirror amplifier 1018 provides additional current gain to drive the laser diode 1002 at the desired power level.

While $\Phi_0$ enables the MOS transistors 1014, one or more of the MOS transistors 1010 are also enabled. Depending on the ratio of enabled MOS transistors 1010 to MOS transistors 1014, the output transistors 1012 conduct a proportional current, and cause a proportional current in the output current mirrors 1018. For example, if $S_0$ enables the corresponding MOS transistor 1010, and the remaining MOS transistors 1010 are disabled, the ratio of enabled MOS transistors 1010 to MOS transistors 1014 causes the output transistors 1012 to provide the maximum current to the output stage 1020 and to the laser diode 1002. In contrast, if $S_0$-$S_3$ enabled all the MOS transistors 1010, the ratio causes less current through the output transistors 1012, and thereby causes less current through the output stage 1020 and to the laser diode 1002.

Like the example low side current channel 400 of FIG. 4, and unlike the example high side current channel 300 of FIG. 3, the example high side current channel 1000 uses one power supply 1022.

FIG. 11 is a block diagram of another example laser diode driver 1100. The example laser diode driver 1100 includes components 1104-1124 similar to those of the laser diode driver 200 of FIG. 2. In contrast to the example laser diode driver 200 of FIG. 2, which selectively couples the example laser diode 202 to a supply voltage to conduct current, the laser diode driver 1100 selectively couples a laser diode device 1102 to a ground terminal to conduct pre-determined current levels through the laser diode 1102.

Figure 12:
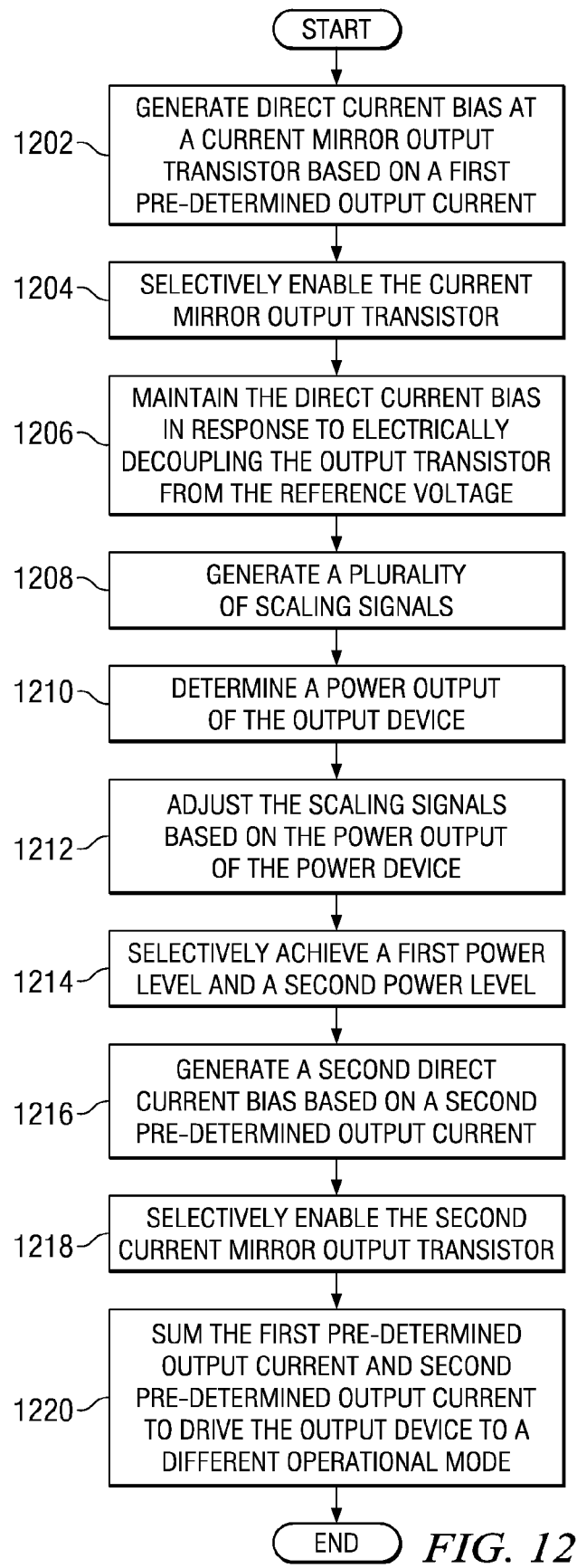
FIG. 12 is a flow diagram of an example process to provide an output device as described herein.

FIG. 12 is a flow diagram of an example process to provide an output device as described herein. In an example implementation, firmware or software instructions stored in a memory may be retrieved and executed by a processor or controller that performs the process of FIG. 12. Alternatively, the process of FIG. 12 may be implemented by dedicated hardware blocks or could be implemented using a combination of hardware, software, and/or firmware. The example process of FIG. 11 begins by generating a direct current bias at a current mirror output transistor including emitter degeneration (block 1202). The generation is based on a pre-determined output current. Then, the current mirror output transistor is selectively enabled to conduct the pre-determined output current (block 1204). The current mirror output transistor may be selectively enabled by, for example, electrically coupling an emitter terminal of the output transistor to a reference voltage. In addition, the selectively enabling the current mirror output transistor may comprise selectively enabling a switching device coupled to the current mirror output transistors based on a data signal. Next, a beta helper circuit coupled to the current mirror output transistor maintains the direct current bias in response to the current mirror output transistor being decoupled from the reference voltage (block 1206).

A plurality of scaling signals are then generated to modify the pre-determined output current (block 1208). A power output of the output device is then determined (block 1210). Then, the scaling signals are adjusted based on the determined power output (block 1212). In the illustrated example, a first one of the scaling signals selectively enables a first portion of the current channels and a second one of the scaling signals selectively enables a second portion of the current channels. The data signals are then modified to selectively achieve a first power level and a second power level (block 1214).

Next, a second direct current bias at a second current mirror output transistor including emitter degeneration is generated based on a second pre-determined output current (block 1216). The second current mirror output transistor is selectively enabled to conduct the second predetermined output current by electrically coupling an emitter terminal of the second output transistor to the reference voltage (block 1218). The first pre-determined output current and the second pre-determined output current are then summed and the result is used to drive the output device to a different operational mode (block 1220). For example, the device may be driven to one of the following example states: a read/cooling state, a biased state, an erasing state, and a writing state Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A current driver to provide an incremental current to an output device, comprising:
    a current channel configured to provide a pre-determined incremental output current, the current channel comprising:
        a current mirror amplifier comprising emitter degeneration;
        a startup transistor electrically coupled to the current mirror amplifier and configured to generate a direct current bias on the current mirror amplifier;
        a beta helper circuit electrically coupled to the current mirror amplifier and the startup transistor, configured to maintain the direct current bias on the current mirror amplifier; and
        a cutoff transistor electrically coupled to an emitter terminal of a current mirror amplifier transistor and to a reference voltage, and configured to selectively couple the emitter terminal to the reference voltage to conduct the pre-determined output current; and
    an output stage electrically coupled to an output of the current mirror amplifier and to an output device, wherein the output stage is configured to provide a current gain in response to the cutoff transistor electrically coupling the emitter terminal to the reference voltage.

2. A current driver as defined in claim 1, further comprising a current scaler coupled to the current channel, configured to selectively generate one or more scaling signals, wherein the scaling signals cause the current channel to provide a different pre-determined incremental output current.

3. A current driver as defined in claim 2, further comprising a sensor coupled to the output device, configured to determine at least one of an output power, a data error rate, a number of power cycles, or a usage time of the output device.

4. A current driver as defined in claim 3, wherein one or more of the scaling signals are based on the sensor.

5. A current driver as defined in claim 2, further comprising a plurality of summers coupled to the output stage and to one or more current channels, configured to selectively sum one or more pre-determined output currents based on the current scaler.

6. A current driver as defined in claim 1, wherein the beta helper circuit comprises a negative feedback loop coupled to the current mirror amplifier to maintain a substantially constant current mirror bias on the current mirror amplifier.

7. A current driver as defined in claim 1, wherein the emitter degeneration comprises emitter degeneration resistors.

8. A current driver as defined in claim 1, further comprising a second current channel configured to provide a second pre-determined incremental output current, wherein the output stage is configured to sum the first and second pre-determined output currents.

9. A current driver as defined in claim 8, wherein the first current channel is configured to cause a first power level in the output device, and the second current channel is configured to cause a second power level in the output device in combination with the first current channel.

10. A current driver as defined in claim 1, wherein the cutoff transistor is configured to couple the emitter terminal to the reference voltage in response to a data signal.

11. A method to provide an output device with an output current, comprising:
    generating, based on a pre-determined output current, a direct current bias at a current mirror output transistor including emitter degeneration;
    selectively enabling the current mirror output transistor to conduct the pre-determined output current by electrically coupling an emitter terminal of the current mirror output transistor to a reference voltage; and
    maintaining the direct current bias via a beta helper circuit coupled to the current mirror output transistor in response to electrically decoupling the current mirror output transistor from the reference voltage.

12. A method as defined in claim 11, further comprising generating a plurality of scaling signals to modify the pre-determined output current.

13. A method as defined in claim 12, further comprising determining a power output of the output device.

14. A method as defined in claim 13, further comprising adjusting the scaling signals based on the power output of the output device.

15. A method as defined in claim 12, wherein a first one of the scaling signals selectively enables a first portion of the current channels, and a second one of the scaling signals selectively enables a second portion of the current channels.

16. A method as defined in claim 11, wherein selectively enabling the current mirror output transistor comprises selectively enabling a switching device coupled to the current mirror output transistor based on a data signal.

17. A method as defined in claim 16, further comprising modifying the data signal to selectively achieve a first power level and a second power level.

18. A method as defined in claim 11, further comprising:
    generating, based on a second pre-determined output current, a second direct current bias at a second current mirror output transistor including emitter degeneration;
    selectively enabling the second current mirror output transistor to conduct the second pre-determined output current by electrically coupling an emitter terminal of the second output transistor to the reference voltage; and
    summing the first pre-determined output current and second pre-determined output current to drive the output device to a different operational mode.

19. A laser diode driver, comprising:
    a current scaler configured to generate a plurality of scaling signals;
    a plurality of current channels electrically connected to the current scaler, wherein each current channel is configured to selectively generate an incremental scaled current based on the scaling signals and a data signal, wherein the data signal selectively enables one or more current channels to produce a desired power level;
    a plurality of current summers, each coupled to the current channels to sum the scaled currents; and
    an output stage coupled to the current summers to receive the summed currents from the current summers, and configured to generate a pre-determined output current based on the data signal and the scaling signals to power a laser diode based on the summed currents, wherein each current channel comprises a plurality of current mirror amplifiers, each current mirror amplifier comprising:
a current mirror input transistor and a current mirror output transistor;
a startup transistor configured to generate a direct current bias on the current mirror;
a beta helper circuit coupled to the current mirror input and output transistors, configured to maintain the direct current bias; and a plurality of cutoff transistors configured to selectively enable the current mirror based on at least one of the scaling signals or the data signal; and
a plurality of degeneration resistors coupled to the current mirror input and output transistors, configured to maintain a substantially constant current in the current mirror amplifier based on the cutoff transistors.

* * * * *